United States Patent
Leussler et al.

(10) Patent No.: US 10,495,705 B2
(45) Date of Patent: Dec. 3, 2019

(54) RF TRANSMIT MODULE WITH A LOCAL FIELD MONITORING UNIT FOR A MAGNETIC RESONANCE EXAMINATION SYSTEM

(71) Applicant: KONINKLIJKE PHILIPS N.V., Eindhoven (NL)

(72) Inventors: Christoph Leussler, Eindhoven (NL); Peter Vernickel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 59 days.

(21) Appl. No.: 15/743,101

(22) PCT Filed: Jul. 12, 2016

(86) PCT No.: PCT/EP2016/066480
§ 371 (c)(1),
(2) Date: Jan. 9, 2018

(87) PCT Pub. No.: WO2017/009315
PCT Pub. Date: Jan. 19, 2017

(65) Prior Publication Data
US 2019/0079151 A1    Mar. 14, 2019

(30) Foreign Application Priority Data

Jul. 15, 2015 (EP) ..................... 15176782

(51) Int. Cl.
*G01R 33/3415* (2006.01)
*G01R 33/36* (2006.01)

(52) U.S. Cl.
CPC ...... *G01R 33/3415* (2013.01); *G01R 33/3607* (2013.01); *G01R 33/3621* (2013.01); *G01R 33/3692* (2013.01)

(58) Field of Classification Search
CPC .................................................. G01R 33/3607
See application file for complete search history.

(56) References Cited

U.S. PATENT DOCUMENTS

| | | | |
|---|---|---|---|
| 6,906,520 B2 | 6/2005 | Heid et al. | |
| 7,397,243 B1 * | 7/2008 | Bulkes | G01R 33/3614 324/307 |
| 8,055,196 B2 | 11/2011 | Biber et al. | |
| 8,379,549 B2 | 2/2013 | Oppelt et al. | |
| 2011/0241681 A1 | 10/2011 | Gudino et al. | |

(Continued)

FOREIGN PATENT DOCUMENTS

| | | |
|---|---|---|
| EP | 0554584 A1 | 8/1993 |
| WO | 2006114749 A1 | 11/2006 |

(Continued)

*Primary Examiner* — Clayton E. LaBalle
*Assistant Examiner* — Jas A Sanghera

(57) ABSTRACT

An radio frequency (RF) transmit module for a magnetic resonance examination system includes a local field monitoring unit that measures a field emitted by an RF transmission element and generates a pick-up coil signal (puc-signal). The puc-signal is amplified and frequency-down-converted by mixing with an oscillator signal. The frequency-down-converted puc-signal and the RF drive signal for the RF transmission element are transferred over a common signal lead. The oscillator signal may also be transferred over the common signal lead.

9 Claims, 8 Drawing Sheets

(56) References Cited

U.S. PATENT DOCUMENTS

2012/0071117 A1   3/2012   Biber et al.
2014/0002087 A1   1/2014   Oppelt et al.
2015/0168516 A1   6/2015   Eberler et al.

FOREIGN PATENT DOCUMENTS

WO   20120152618 A1   11/2012
WO   20140141109 A1    9/2014

* cited by examiner

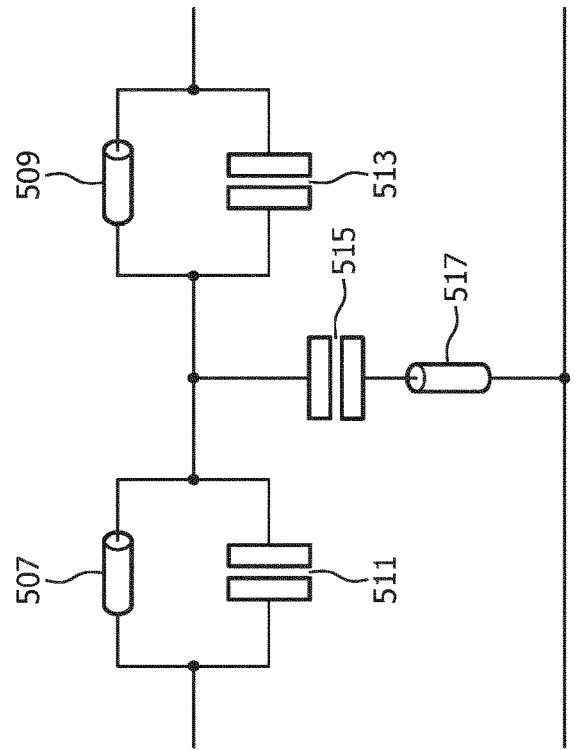
FIG. 7
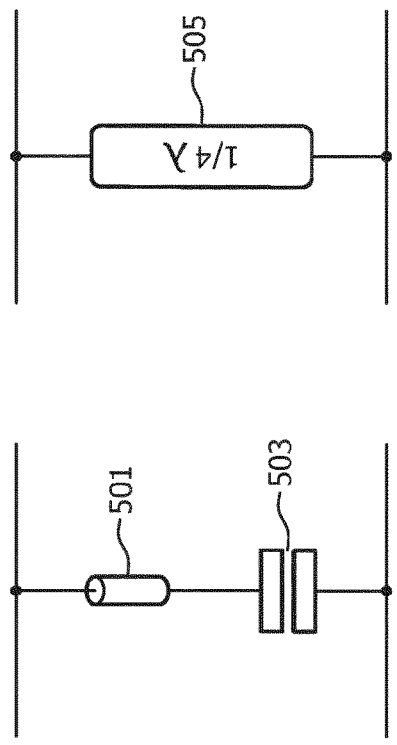
FIG. 6
FIG. 5

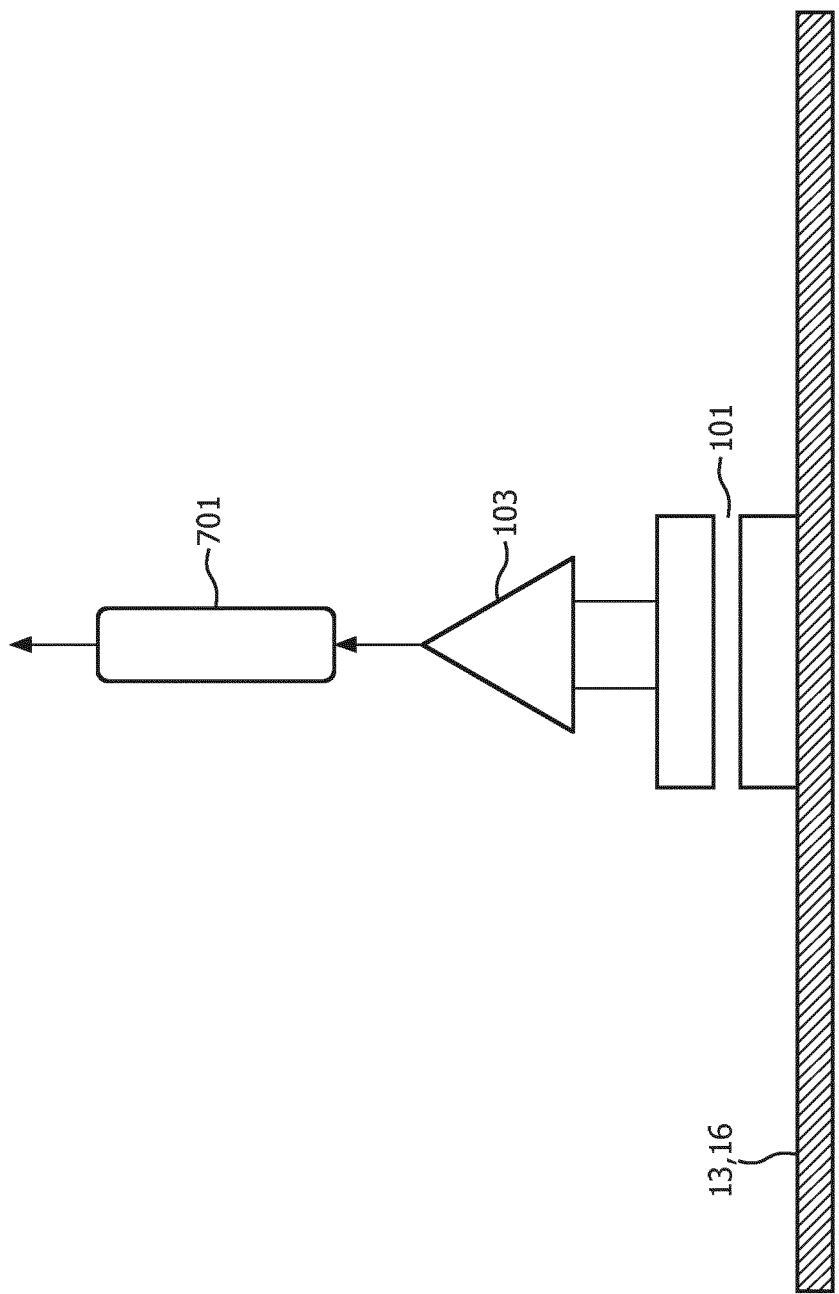

RF TRANSMIT MODULE WITH A LOCAL FIELD MONITORING UNIT FOR A MAGNETIC RESONANCE EXAMINATION SYSTEM

CROSS REFERENCE TO RELATED APPLICATIONS

This application is a U.S. national phase application of International Application No. PCT/EP2016/066480, filed on Jul. 12, 2016, which claims the benefit of EP Application Serial No. 15176782.9 filed on Jul. 15, 2015 and is incorporated herein by reference.

FIELD OF THE INVENTION

The invention pertains to a radio frequency (RF) transmit module with a local field monitoring unit.

BACKGROUND OF THE INVENTION

Such an RF transmit module is known from the international application WO2006/114749. The known RF transmit module is formed by a circuit arrangement for operating a multi-channel transmit/receive antenna in an magnetic resonance examination system.

The known circuit arrangement comprises a plurality of RF coils (coil segments) which are each connected to a transmit/receive channel. A multi-channel RF amplifier (or several one-channel RF amplifiers) is coupled to the RF coils over the transmit/receive channels via transmit/receive switches. Further, a number of pick-up coils are provided for receiving RF signals for monitoring purposes. The RF signals that are received by these pick-up coils are routed via the transmit/receive switches to a pick-up coil detection unit for processing. The pick-up coils are connected to the pick-up coil detection unit over separate channels.

SUMMARY OF THE INVENTION

An object of the present invention is to provide an RF transmit module for a magnetic resonance examination system that has a simpler set up.

This object is achieved according to the invention by the RF transmit module comprising
- an RF transmission antenna element,
- an RF power source with an RF-control to generate an RF drive signal,
- a signal lead circuited between the RF power source and the RF transmission antenna element to supply the RF drive signal to the RF transmission element,
- a local field monitoring unit to measure the local field strength emitted by the RF transmission element and generate a pick-up coil signal (puc-signal) that represents the measured local field strength,
- a mixer configured to frequency-convert the puc-signal into a frequency-converted puc-signal and circuited between the local field monitoring unit and the signal lead to transmit the frequency-converted puc-signal over the signal lead to the RF-control. The RF transmit module of the invention comprises the RF transmission element, for example formed by a coil conductor loop, a ring or rung of a birdcage or TEM coil, a dipole or a dielectric resonator. This RF transmission element is driven from the RF power source by way of the RF drive signal transmitted over the signal lead. The signal lead can be a coax-cable. The local field monitoring unit, e.g. a pick-up coil, local current sensor or a local capacitor, functions to measure the local field strength of the RF transmission element. The puc-signal is frequency-converted (up or down) and transmitted over the signal lead to the RF-control. The RF-control controls the RF power source. The RF power source may include an RF power amplifier that is controlled by the RF-control. The puc-signal typically has a bandwidth of about 700 kHz and may be (down)converted to a frequency-converted puc-signal having a carrier frequency in a range between 1 MHz to 100 MHz, or between 5 MHz and 100 MHz, or between 10 MHz and 100 MHz. Good results are achieved by frequency (down) conversion into a frequency band at 50 MHz. Within these ranges narrow bands around the Larmor frequency at issue (42 MHz/T for protons) are to be excluded to avoid interference with the radio frequency operation of the transmission by the RF antenna and the acquisition of magnetic resonance signals. Usually the signal lead is formed by a coax cable which has low loss in the frequency range of 1.5 MHz or 10 MHz to 100 MHz.

In one aspect of the present invention, the RF transmit module enables to transmit the measured local field strength, represented in the frequency converted puc-signal, and the RF drive signal over the same signal lead. In this way hardly any additional cabling is needed to transfer the measured local field strength to the control of the RF power source. The frequency conversion is preferably performed downward. This leads to smaller losses over the single signal lead. Preferably the frequency may be selected, in accordance with commercially available components such as filters. As an alternative the mixer can be configured for down mixing to zero frequency of the frequency converted puc-signal. That is, the puc-signal is directly converted into a DC puc-signal. This can be realised with a cheap ADC and simpler filter components.

In summary, the radio frequency (RF) transmit module of the present invention comprises the local field monitoring unit which measures the field emitted by an RF transmission element and generates a puc-signal. The puc-signal is amplified and frequency-down-converted by mixing with an oscillator signal. The signal lead functions as a common signal lead for the RF drive signal and the puc-signal. The frequency-down-converted puc-signal and the RF drive signal for the RF transmission element as transferred over the common signal lead. The oscillator signal may also be transferred over the common signal lead. On the basis of the puc-signal the $B_1$-field generated by the RF-transmission element can be monitored. For example, the puc signal may represent the local RF current in the coil loop. Further, the puc-signal is a basis for SAR control and monitoring and system logging. Additionally the puc-signal can be used as a input for the RF power source feeding the RF transmission element, notably to perform a digital pre-distortion for the RF power source.

The local field monitoring unit may include a local pick-up coil to pick-up flux from the field of the RF transmission element. Also other types of field sensors may be employed that are sensitive the the local field strength of the RF transmission element and which form the puc-signal representing the local field strength. For example an electric dipole antenna that is sensitive to the electric field component of the field may be employed to measure the electric field component and generate the puc-signal representing the electric field strength at the RF transmission element. Further, a capacitive divider may be employed to generate the puc-signal. Alternatively, the local field monitoring unit may be implemented as voltage or current sensors to measure the voltage/current of the forward and reflected power to and from the RF transmission elements and derive the local field strength from the measured voltages/current. These may be measured at a directional coupler between the RF power source and the RF transmission element.

These and other aspects of the invention will be further elaborated with reference to the embodiments defined in the dependent Claims.

In an embodiment of the invention, a pre-amplifier is circuited between the local field monitoring unit and the mixer. Preferably, the local field monitoring unit draws only little power from the field emitted by the RF transmission element. In this way the local field monitoring has only a small effect of the power efficiency of the RF transmission element. The low signal picked-up by the local field monitoring unit is amplified by the pre-amplifier. Preferably, the pre-amplifier is located close to the local field monitoring unit. This avoids that an electrical conductor between the local field monitoring unit and the pre-amplifier could pick-up signal from the signal lead and thus cause cross talk between the local field monitoring unit and the signal lead. In this way crosstalk is reduced with other antenna elements (coil conductors of other coils). The pre-amplifier and the local field monitoring unit are preferably integrated in one single unit. This further enables that the local field monitoring unit can be positioned in close proximity to the RF transmission element, notably if the local field monitoring unit is a pick-up coil with a conductor loop which is magnetically sensitive. If the local field monitoring unit is sensitive for electrical fields, e.g. the local field monitoring unit is formed a dipole or small dielectric resonator is located close to a tuning capacitor of the RF transmission element. The pre-amplifier typically has a gain of 25 dB and accordingly the frequency converted puc signal may be transmitted over the signal lead at a loss of 5 dB to 10 dB.

In a further embodiment the invention is employed in a multi-channel RF transmit module. In this embodiment there is a plurality of RF transmission elements to which RF drive signals are fed over signal leads of each channel. Several local field monitoring units are provided to measure the local field strength of the RF transmission elements. The puc-signals of these local field monitoring units are frequency converted by the mixer and the ensuing frequency-converted puc-signals are transmitted over the signal leads of the respective channels. The mixer may be implemented as mixer units for respective channels or mixer-units may be shared by a group of channels.

In a further embodiment of the invention, the RF transmit module is provided with a matching circuit for impedance matching between the RF transmission antenna element and the signal lead. A mixer-notch filter is provided to attenuate the RF drive signal avoiding the RF drive signal to reach the mixer.

In a further embodiment of the invention the oscillator signal for the mixer is supplied over the signal lead as well. To that end an oscillator to generate the oscillator signal is coupled into the signal lead. An oscillator-notch filter is circuited between the oscillator and the signal lead to attenuate the RF drive signal and avoid the RF drive signal to reach the oscillator. The oscillator signal is supplied from the signal lead to the mixer via the mixer-notch filter. The mixer-notch filter and the oscillator-notch filter isolate the mixer and the oscillator, respectively, from the high-power RF drive signal. Preferably, a mixer-diplexer is circuited between the mixer-notch filter and the mixer to apply the oscillator signal to the mixer. The mixer-diplexer separates the oscillator signal to the mixer from the frequency-downconverted puc-signal from the mixer. From the applied oscillator signal and the amplified puc-signal, the mixer generates the frequency-converter puc-signal. Preferably, a oscillator-diplexer is circuited between the oscillator-notch filter and the oscillator to feed the oscillator signal to the signal lead. The oscillator-diplexer separates the oscillator signal from the oscillator and the frequency-downconverted puc-signal outcoupled from the signal lead.

In a further embodiment, the matching circuit, the mixer-notch filter, mixer-diplexer, with the local pick-up unit and the pre-amplifier are integrated as a single module, e.g. on a single printed-circuit board. This integrated module is easily coupled to the signal lead and to the RF antenna element.

Alternatively, the mixer-diplexer and the mixer can be located remotely (for example in the coil housing typically 10-20 cm) from the local field monitoring unit.

These and other aspects of the invention will be elucidated with reference to the embodiments described hereinafter and with reference to the accompanying drawing wherein

BRIEF DESCRIPTION OF THE DRAWINGS

FIGS. 5, 6 and 7 show diagrams of alternatives for the stopband-notch filters.

FIG. 10 is a schematic representation of a capacitive local field monitoring unit employed in the present invention;

DETAILED DESCRIPTION OF THE EMBODIMENTS

Figure 1:
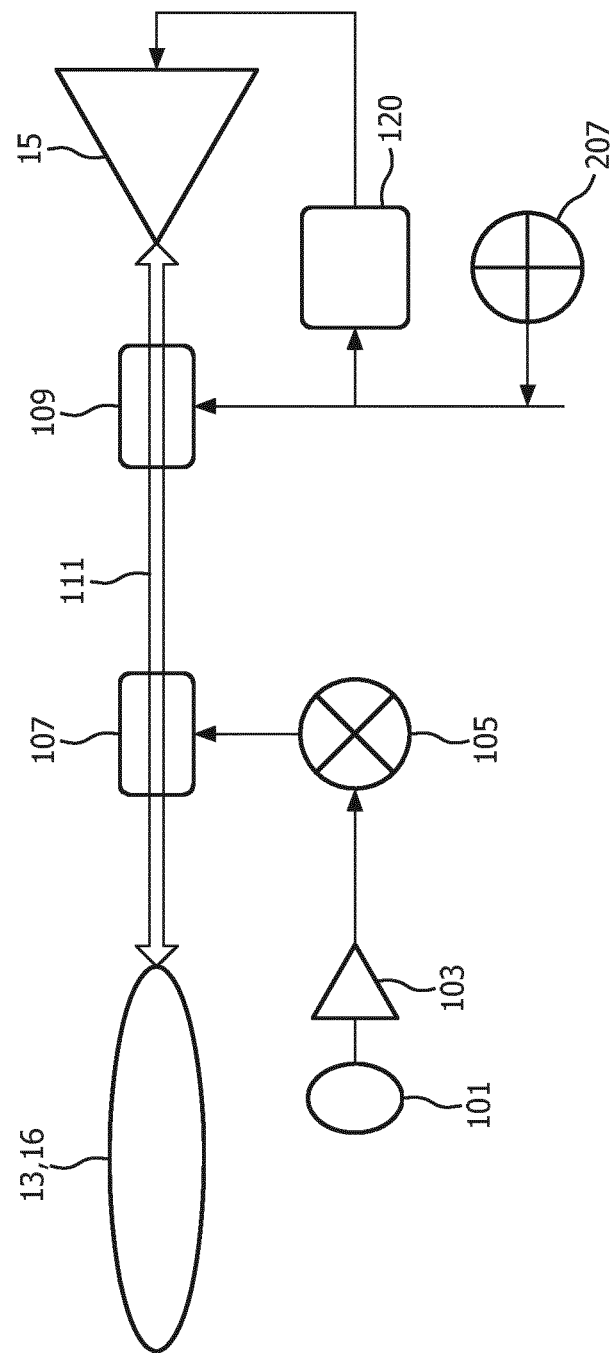
FIG. 1 is a schematic representation of the RF transmit module of the invention.

FIG. 1 is a schematic representation of the RF transmit module of the invention. The signal lead 111, for example a coax cable couples the RF power source 15 to the RF transmission element 13,16. The RF power source is implemented as an RF amplifier, that is typically an adjustable amplifier. The RF transmission element is implemented as a tuned coil loop. The RF-transmission element may be a dipole coil element, as used for UHF applications. Here the loop is located in the centre of the dipole as there the electrical current is maximal.

The RF transmission element may also be a TEM coil element. The local field monitoring unit 101 picks-up a small amount of energy of the transmitted RF ($B_1$) field from the tuned coil loop 13,16. The local field monitoring is e.g. implemented as a small pick-up coil. The low puc-signal generated by the pick-up coil is a weak electric voltage or current signal. The low puc-signal is amplified by the pre-amplifier, that is preferably integrated with the pick-up coil. The amplified puc-signal is applied to the mixer 105 for frequency conversion. Preferably, the amplified puc-signal is frequency down-converted into a frequency band of tens of MHz, for example around 50 MHz, e.g. in the range between 10 MHz and 100 MHz, and coupled into the signal lead 111 by way of a splitter 107. The oscillator signal for the mixer 105 is generated by the oscillator 207. The oscillator signal is coupled into the signal lead 111 at the splitter 109 and outcoupled at splitter 107 from the signal lead 111 to the control port of the mixer 105. At the input port of the mixer the amplified puc-signal is applied. By way of a splitter 109 the frequency-downconverted puc-signal is outcoupled from the signal lead 111 to an RF controller 120. The RF controller 120 has as its main function to control the RF amplifier 15 to produce the drive signal in accordance with a selected RF waveform. On the basis of the down-converted puc-signal the RF controller 120 controls the RF amplifier so that the desired B.sub.1-field is transmitted by the tuned coil loop 13,16. Also, the local field monitoring unit may detect the electrical field of the RF antenna element 13,16 to exceed a pre-determined safety level. In that event, on the basis of the puc-signal the RF controller is configured to switch-off the RF power source 15 to avoid a hazardous situation of a high SAR to occur or to persist.

Figure 2:
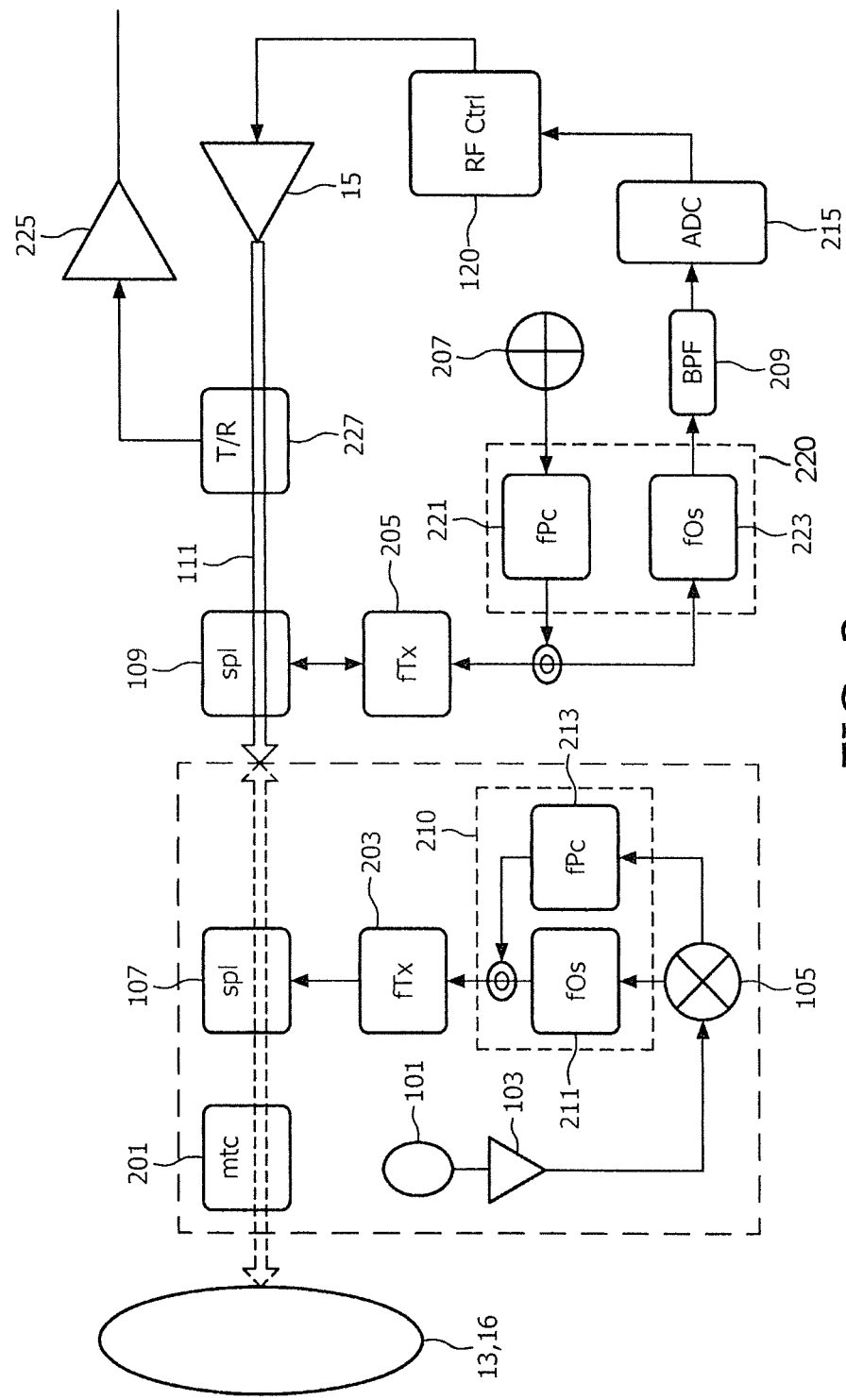
FIG. 2 is a schematic representation of a more detailed implementation of the RF transmit module of the invention.

FIG. 2 is a schematic representation of a more detailed implementation of the RF transmit module of the invention. The frequency down-converted puc signal is then formed as the frequency-difference signal of the amplified puc signal and the oscillator signal. For example, the puc-signal is in the 127 MHz puc-frequency band corresponding to a main field strength of 3T of the magnetic resonance examination system. The oscillator signal is for example in the 177 MHz oscillator-frequency band, so that the frequency down-converted puc signal is in the 50 MHz frequency band that has low losses over the signal lead 111. A stopband-notch filter 211 that blocks the 177 MHz oscillator-frequency band is arranged between the mixer and the splitter 107. Another stopband-notch filter 213 that blocks the puc-frequency band is circuited between the mixer 105 and the single lead 111. The stopband-notch filters 211 and 213 are arranged as a mixer-diplexer circuit 210. The mixer-diplexer circuit functions to provide the oscillator signal only to the control port and not into the output port of the mixer. The mixer-diplexer circuit further functions to prevent the puc-signal to by-pass the mixer into the signal lead 111. A puc-stopband-notch 203 filter with a stopband corresponding to the frequency band of the RF drive signal (127 MHz) is circuited between the mixer 105 and the splitter 107 to prevent the RF drive signal to reach the mixer 105.

Another oscillator-stopband-notch filter 205 is circuited between the oscillator 207 and the splitter 109 to block the RF drive signal from reaching the output port of the oscillator. In order to avoid that the oscillator signal to reach the RF controller a stopband-notch filter 223 is circuited between the output port of the oscillator and the RF controller 120. Another stopband-notch filter 221 is circuited between the splitter 109 to avoid any residual signals in the puc-frequency band to reach the oscillator. The stopband-notch-filters 221 and 223 are implemented as an oscillator-diplexer 220. The frequency-downconverted puc-signal is fed over the oscillator-diplexer 220 to a bandpass filter 209 to an analogue-to-digital converter (ADC) 215. The bandpass filter matches the frequency-down-converted puc signal to the input characteristic of the ADC. The digital puc-signal from the ADC is fed to the digital RF controller 120 to control the RF amplifier 15.

A transmit-receive (T/R) switch 227 is arranged in the signal lead 111 to switch the RF transmit module between transmit and receive functions. In the receive function, the RF signal for the RF antenna element 13,16 is fed to a signal amplifier 225 and then to the reconstructor. In the transmit function, the RF power source 15 generates the drive signal over the signal lead 11 to activate the RF antenna element to transmit the B1 field. A matching circuit is 201 provided to couple the signal lead 111 to the RF antenna element 13,16.

Figure 3:
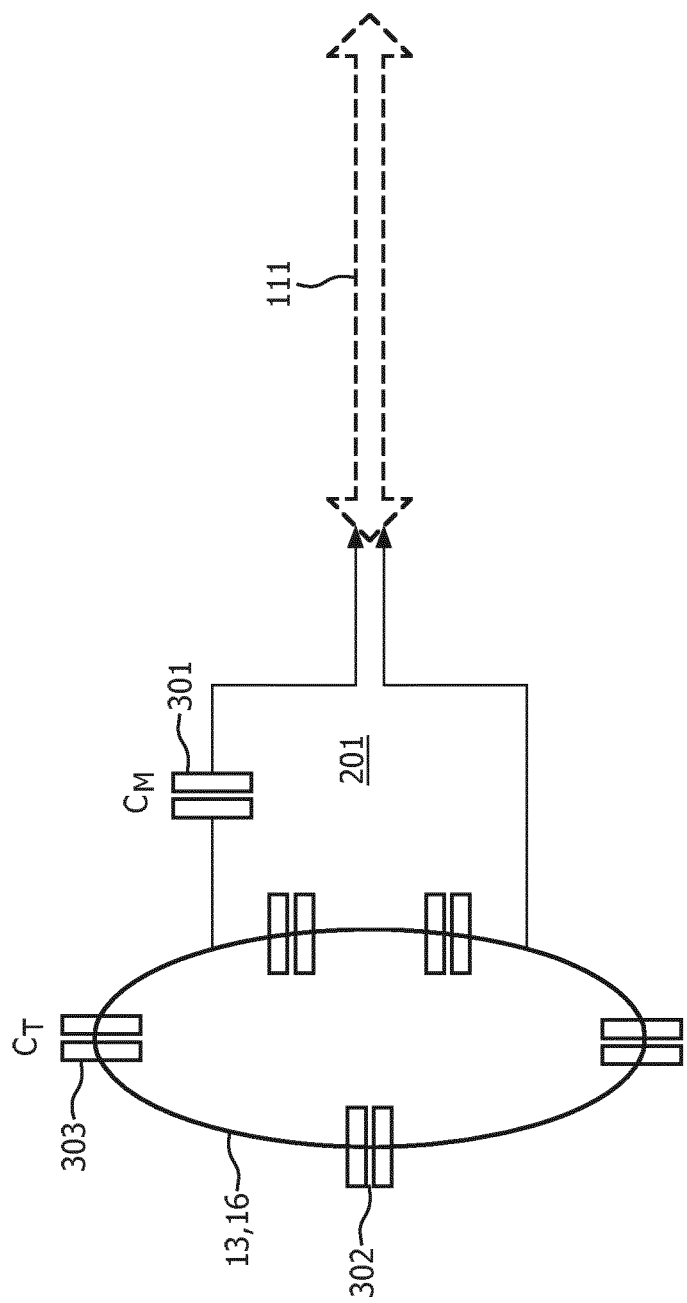
FIGS. 3 and 4 show diagrams of matching circuits employed in the invention.
Figure 4:
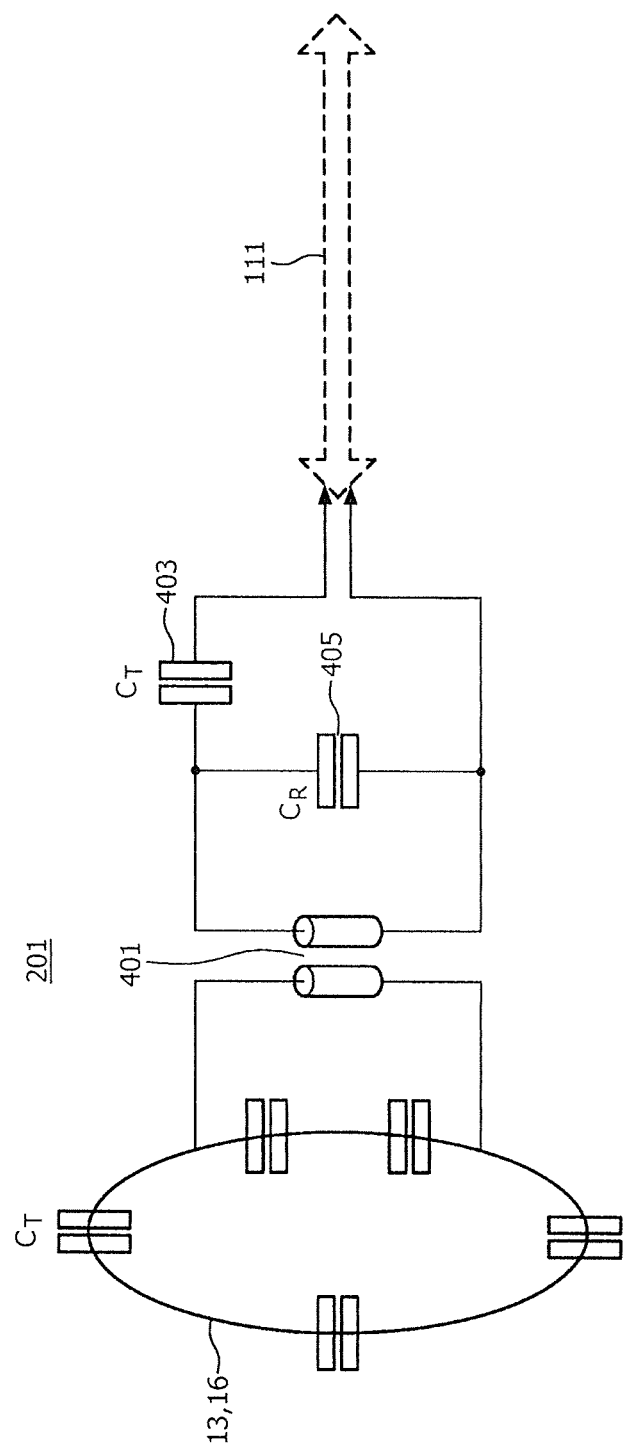

FIGS. 3 and 4 show diagrams of matching circuits employed in the invention. The RF transmission element 13,16 is formed as a coil loop with tuning capacitors 302, 303 to render the coil loop resonant in the Larmor frequency band for transmit or receive. An adjustable capacitor is provided as a tuning capacitor 303. The coil loop is coupled to the signal lead 111 over a capacitive matching circuit 201 that includes a matching capacitor 301. In the alternative of FIG. 4, the matching circuit couples the coil loop to the signal lead inductively over a transformer 401 and additional capacitive matching is done by the matching capacitance 403.

FIGS. 5, 6 and 7 show diagrams of alternatives for the stopband-notch filters. The embodiment of FIG. 5 is an LC-series circuit of an inductor 501 and a capacitance 503. The embodiment of FIG. 6 is a ¼.lamda.-lead 505 tuned to the appropriate frequency stopband. The embodiment of FIG. 7 is an LC-series circuit of an inductor 517 and a capacitance 515, that is arranged at a common point between parallel LC circuits 507, 511; 509, 513 in series.

Figure 8:
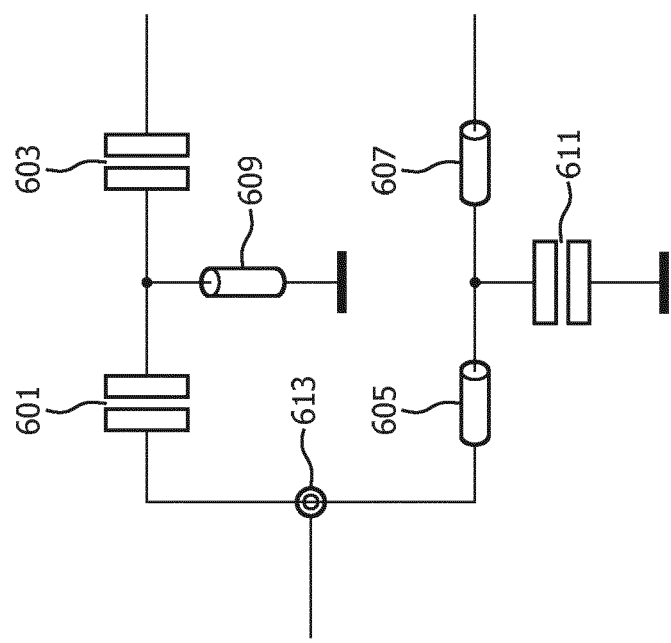
FIG. 8 shows a circuit diagram of an example of a diplexer.

FIG. 8 shows a circuit diagram of an example of a diplexer. The diplexer has two filter branches connected to a common point 613. The high-frequency branch is formed by series capacitances 601, 603 with an inductor 609 circuited between the series capacitances. The high-frequency branch has a high-frequency (e.g. 177 MHz) passband. The low-frequency branch is formed by series inductances 605, 607 with capacitor 611 circuited between the series capacitances. The low-frequency branch has a low-frequency (e.g. 50 MHz) passband. At the common point both high- and low-frequency signals are present and are separated into the high- and low frequency component over the respective filter branches. This circuit can be employed as the mixer-diplexer 210 which at its common point has the outgoing frequency down-converted puc-signal as the low-frequency signal and the oscillator signal as the high-frequency signal. The circuit of FIG. 8 can also be employed as the oscillator-diplexer 220. Then, at the common point the high-frequency signal is the oscillator signal from the oscillator and the low-frequency signal is the frequency down-converted puc-signal outcoupled from the signal lead 111 to the ADC 215.

Figure 9:
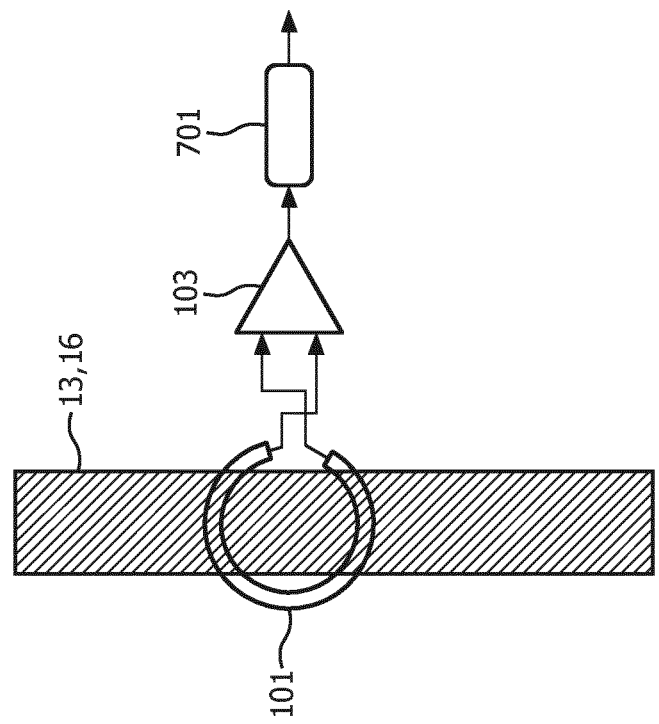
FIG. 9 is a schematic representation of an inductive local field monitoring unit employed in the present invention.

FIG. 9 is a schematic representation of a local inductive field monitoring unit employed in the present invention. The puc-coil loop 101 is mounted on a part of the strip of the coil loop 13,16 of the RF antenna element 13,16. However, The puc loop coil has no galvanic contact to the strip of the coil loop. The puc-coil loop 101 is connected to the pre-amplifier 103. The output amplified puc-signal from the pre-amplifier is applied to the mixer over a balun 701. The balun supress cable currents, so that B.sub.1 field profile of the puc-coil loop is not distorted. The balun provides symmetry for the puc-coil loop. In this way the balun avoids that cable shield of the coax cable to distort the symmetry of the puc-coil loop and the puc-coil loop to become less effective.

FIG. 10 is a schematic representation of a capacitive local field monitoring unit employed in the present invention. The capacitance 101 is disposed on the strip 13,16 of the coil loop. The local capacitor 101 is connected to the pre-amplifier 103. The output amplified puc-signal from the pre-amplifier is applied to the mixer over the balun 701.

Figure 11:
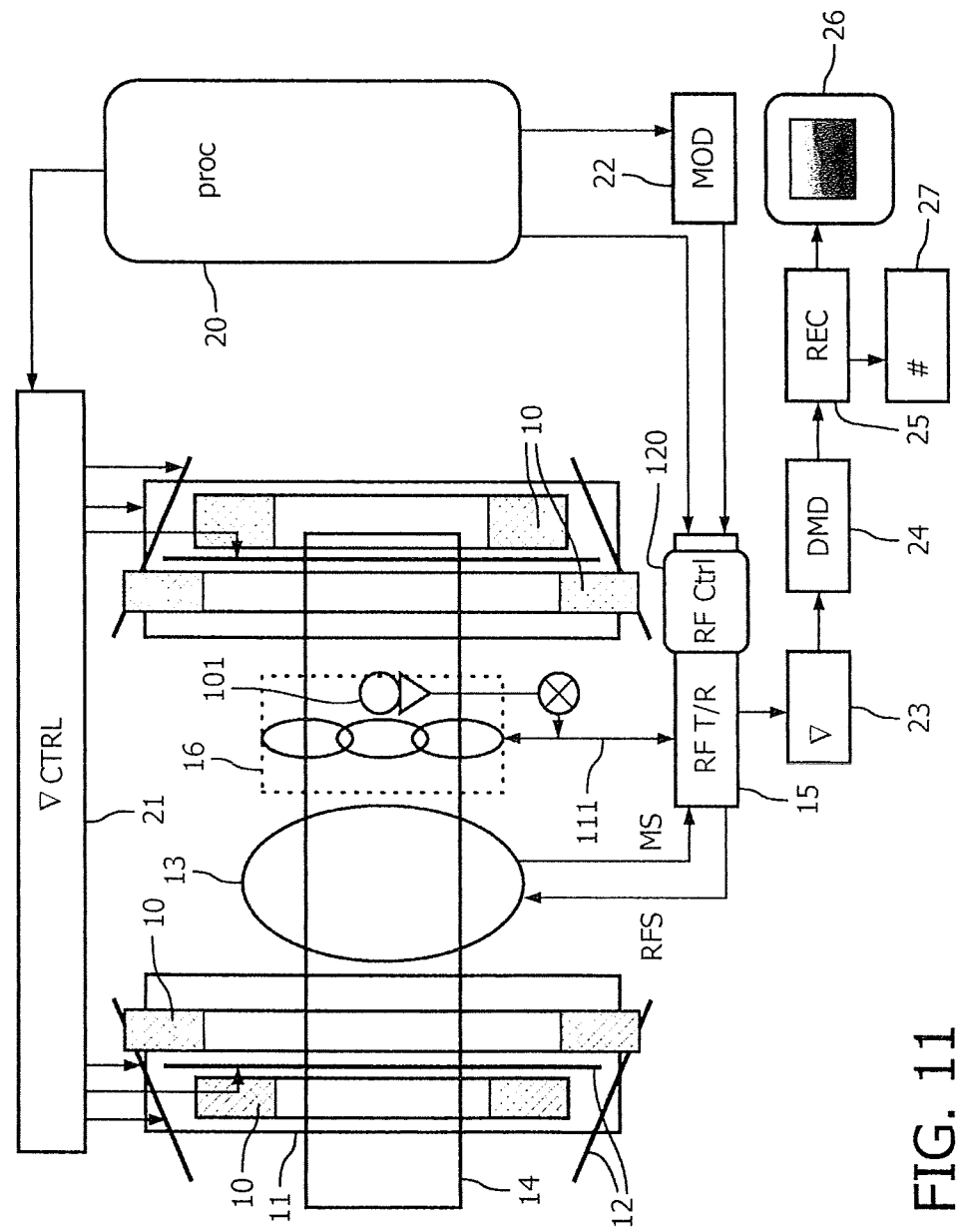
FIG. 11 is a schematic representation of an magnetic resonance examination system in which the RF transmit module of the invention is incorporated.

FIG. 11 shows diagrammatically a magnetic resonance imaging system in which the invention is used. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient to be examined placed on a patient carrier 14, e.g. a moveable patient table, is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible. The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antenna, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array. The demodulated magnetic resonance signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, the control software is loaded, for example, into the control unit 20 and the reconstruction unit 25. The control software supervises the RF controller 120 of the RF transmit module. The control software also supervises the gradient control 21.

The invention claimed is:

1. A radio frequency (RF) transmit module for a magnetic resonance examination system, the RF transmit module comprising:
    an RF transmission antenna element,
    an RF power source with an RF-control configured to generate an RF drive signal,
    a signal lead circuited between the RF power source and the RF transmission antenna element configured to supply the RF drive signal to the RF transmission antenna element,
    a local field monitoring unit configured to measure a local field strength emitted by the RF transmission antenna element and generate a pick-up coil signal (puc-signal) that represents the measured local field strength,
    a mixer configured to frequency-convert the puc-signal into a frequency-converted puc-signal and circuited between the local field monitoring unit and the signal lead to transmit the frequency-converted puc-signal over the signal lead to the RF-control.

2. The RF transmit module of claim 1, wherein the frequency-converted puc-signal has a carrier frequency in a frequency range of 1 MHz to 100 MHz.

3. The RF transmit module of claim 1, further including:
    a pre-amplifier configured to amplify the puc-signal, the preamplifier being circuited between the local field monitoring unit and the mixer, the preamplifier being circuited to apply the pre-amplified puc-signal to the mixer to generate the frequency-converted puc-signal.

4. The RF transmit module of claim 1, wherein a pre-amplifier is located on-board of the local field monitoring unit.

5. The RF transmit module of claim 1 comprising:
a plurality of RF transmission antenna elements and a plurality of signal leads coupling the RF transmission antenna elements to the RF power source,
a plurality of local field monitoring units, each of the plurality of local field monitoring units being associated with one of the plurality of RF transmission antenna elements to measure the local field strength emitted by the one of the plurality of RF transmission antenna elements, wherein the mixer is configured to frequency-convert puc-signals generated by the plurality of local field monitoring units into frequency-converted puc-signals and is circuited between the individual local field monitoring units and the signal leads to transmit the frequency-converted puc-signals over the signal leads to the RF-control.

6. The RF transmit module of claim 1, including:
an oscillator coupled to the signal lead and configured to transfer an oscillator signal over the signal lead to the mixer, and
an oscillator-notch filter circuited between the signal lead and the oscillator and configured to attenuate the RF drive signal.

7. The RF transmit module of claim 6, wherein a mixer-diplexer is circuited between the signal lead and the mixer and configured to separate the frequency-converted puc-signal and the oscillator signal.

8. The RF transmit module of claim 6, wherein an oscillator-diplexer is circuited between the signal lead and the oscillator and configured to separate the frequency-converted puc-signal from the signal lead and the oscillator signal from the oscillator.

9. The RF transmit module of claim 1, including:
a matching unit for impedance matching between the RF transmission antenna element and the signal lead is circuited between the signal lead and the RF transmission antenna element,
a mixer-notch filter is circuited between the signal lead and the mixer to attenuate the RF drive signal, and
wherein the matching unit, the mixer-notch filter, the local field monitoring unit, and a pre-amplifier are integrated in a single integrated monitoring module that is directly connected to the RF transmission antenna element.

* * * * *